Nov. 30, 1965

S. L. MILLER 3,220,896

TRANSISTOR

Filed July 17, 1961

INVENTOR.
SOLOMON L. MILLER
BY
Christie, Parker & Hale
ATTORNEYS 3,220,896
Patented Nov. 30, 1965

3,220,896

TRANSISTOR

Solomon L. Miller, Sunnyvale, Calif., assignor, by mesne assignments, to Raytheon Company, Lexington, Mass., a corporation of Delaware Filed July 17, 1961, Ser. No. 124,461
5 Claims. (Cl. 148—33.5)

Figure 1:
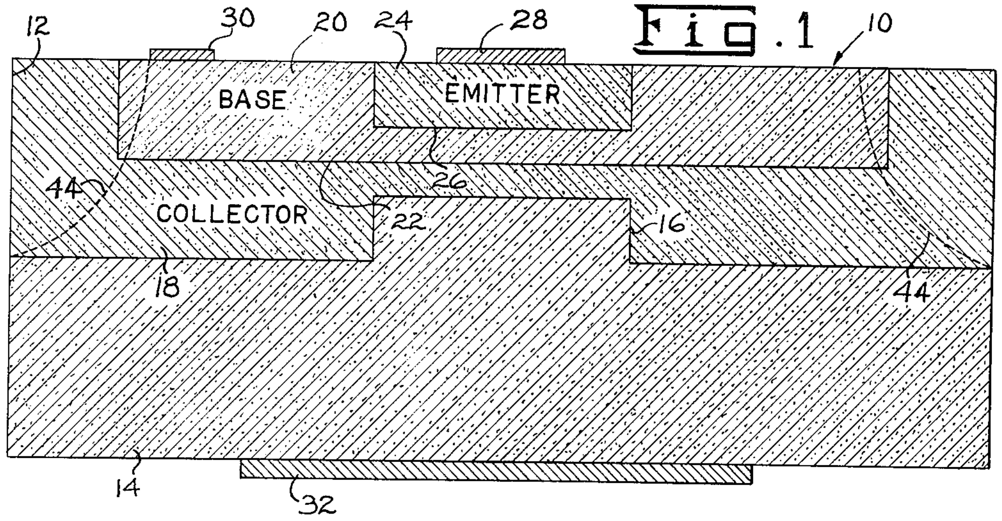

This invention relates to improvements in junction transistors.

A typical junction transistor includes a thin layer of one type of semiconductor material sandwiched between two layers of the other type of semiconductor material. The thin center layer is the base, one of the outer layers is the emitter, and the other outer layer is the collector. The interface between the base and the emitter forms an emitter junction, and the interface between the base and the collector is the collector junction. For the best performance the junctions are made as parallel and as close together as possible.

An important use of a junction transistor is as a switching element for providing a high impedance under one set of operating conditions and a low impedance under a different set of operating conditions. The ideal transistor switch would have zero impedance when closed, and instantaneous infinite impedance to very high voltages when open, i.e., low storage, high breakdown, and low capacity characteristics. The two latter qualities are achieved by using collector materials of relatively high resistance, but such an approach has the undesirable effect of increasing the impedance of the transistor when it is operated as a closed switch.

Another difficulty presented by a junction transistor used as a switch is that at operation near saturation, i.e., low impedance, minority carriers are stored near the collector junction and limit the speed at which the transistor can be switched from a low to a high impedance state. This problem is compounded in certain types of transistors, such as the planar and mesa transistors, because the collector junction is of substantially greater area than the emitter junction. At low impedance operation many of the minority carriers in the vicinity of the collector junction are therefore spread over a relatively large area not in the main path of collector current flow so they do not aid efficiently the flow of current, but they do prolong current flow when the transistor is switched to the high impedance state. This latter effect is commonly called storage.

This invention provides an improved junction transistor in which a relatively high resistance collector layer may be used without commensurately increasing the series resistance of the transistor by providing better concentration of minority carriers in the main path of collector current through the transistor. This results in lower impedance when the transistor is fully conducting higher breakdown voltage when the transistor is turned off, and faster switching from low to high impedance, due to lower capacity and lower storage time.

In terms of apparatus, the invention is a transistor which includes a semiconductor body that has a collector, a base, and an emitter separated respectively by collector and emitter junctions. An electrode is attached to the collector, and means are provided to form a substantially lower effective resistivity path to the flow of electric current in a direction perpendicular to the collector junction than in a transverse direction.

In the presently preferred form, the lower resistivity path to the flow of electric current in a direction perpendicular to the collector junction is obtained by the use of a mesa of relatively high conductivity substrate extending into the collector toward the collector junction and being substantially congruent to and in line with the emitter junction. Preferably, a base is diffused into the collector to form a relatively large area collector junction, and an emitter is diffused into the base layer to form a smaller area emitter junction overlying the mesa on the high conductivity substrate.

In terms of method for making a junction transistor, the invention includes the steps of forming a mesa on the surface of a substrate body of semiconductor material, depositing a layer of semiconductor material on the mesa and surrounding body, and thereafter forming spaced collector and emitter junctions over the mesa in the substrate.

Preferably, the substrate is a degenerate semiconductor material of relatively high conductivity. A layer of semiconductor material of relatively low conductivity is epitaxially deposited on the substrate. Thereafter, a base layer is formed by diffusing a base impurity material into the epitaxially grown layer, and an emitter is formed by difusing an emitter impurity material into the base to form an emitter junction.

These and other aspects of the invention will be more fully understood from the following detailed description in which:

FIG. 1 is a schematic diagram of the presently preferred embodiment of the invention; and FIGS. 2–5 show the steps in forming the transistor shown in FIG. 1.

Referring to FIG. 1, a transistor 10 includes a body 12 of semiconductor material, e.g., silicon. Preferably, the lower portion of the body includes a degenerate substrate layer 14, of relatively high conductivity, say about .005 ohm-cm. Degeneracy of the substrate is obtained by adding to it a relatively high concentration of impurity material, say about $10^{19}$ impurity atoms/cc. of semiconductor material. The impurity material may be either p or n type, but for the sake of illustration it is assumed that the transistor is a n-p-n- type, and therefore the impurity in the substrate is n type, such as phosphorus, or preferably antimony which diffuses slowly during subsequent diffusion processes used to form the base and emitter. The degenerate substrate layer includes a mesa 16 which extends upwardly into a collector layer 18, which is relatively lightly doped, say with about 5 x $10^{14}$ n-type impurity atoms/cc. to have a relatively high resistance.

A rectangular base layer 20 of relatively large bottom area extends down into the collector layer 18 to form a collector junction 22 parallel to the top of the mesa 16 and to the surrounding interface between the collector layer and degenerate substrate. As can be seen in FIG. 1, the lateral extent of the collector junction 22 is substantially greater than the top of the mesa. The base layer is preferably formed by diffusing a p-type impurity, such as boron, into the collector layer. A typical base layer has an impurity concentration of about $10^{18}$ impurity atoms/cc. of semiconductor material at its surface, with the concentration decreasing toward the collector junction where the net impurity concentration is zero.

An emitter layer 24 extends down into the base layer 20 directly over the mesa 16 and forms an emitter junction 26 parallel to, congruent with, and in line with the top of the mesa 16. The emitter layer is preferably formed by diffusing an n-type impurity, such as phosphorous, into the base layer. A typical emitter layer has an impurity concentration of about $10^{20}$ impurity atoms/cc. of semiconductor material at its surface, with the concentration decreasing toward the emitter junction where the net impurity concentration is zero. An emitter electrode contact 28 is bonded to the emitter layer, a base electrode contact 30 is bonded to the base, and a collector electrode contact 32 is bonded to the bottom of the degenerate substrate 14.

Although not entirely critical, the thickness of the degenerate substrate (not including the mesa) is between 100 and 500 microns. The height of the mesa is preferably between about 20 and about 50 microns. The thickness of the collector layer directly above the mesa is preferably between about 5 and about 15 microns, and the thickness of the base between the emitter junction and the collector junction is between about ½ and about 5 microns. Preferably, the thickness of the base from its top surface to the collector junction is between about three and about ten microns. The thickness of the emitter layer is between about 2 and about 8 microns. The total thickness of the semiconductor material overlying the mesa preferably is between about 15 and about 25 microns.

Figure 2:
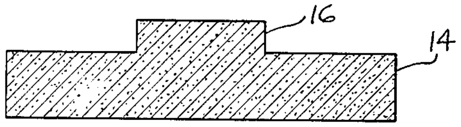

A transistor of the type shown in FIG. 1 is made as illustrated in FIGS. 2–5. Referring to FIG. 2, the mesa 16 is formed on the top surface of the piece of degenerate substrate 14 by conventional etching or cutting methods. Thereafter, the layer 18 of semiconductor material is deposited by conventional epitaxial techniques on the mesa and the surrounding degenerate substrate surface. Epitaxial deposition simply means the controlled growth of a continuous crystalline material on a crystalline substrate and is described in the literature. For example, see the article entitled, "Epitaxial Silicon Film by the Hydrogen Reduction of $SiCl_4$," by Henry C. Theuerer in the Journal of Electrochemical Society, July 1961, vol. 108, pp. 649–653.

Figure 3:
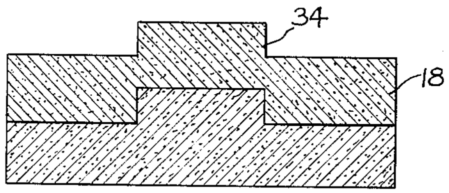
Figure 4:
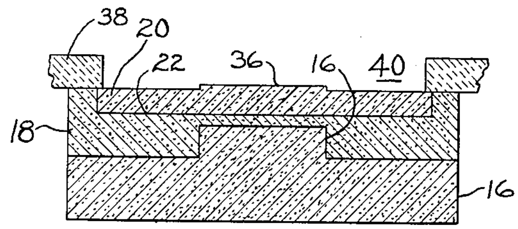
Figure 5:
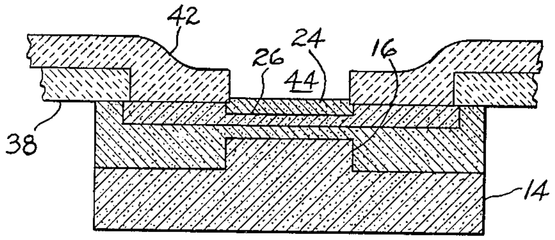

As shown in FIG. 3, the epitaxial deposition results in a raised mesa 34 on the epitaxially grown layer, which includes an n-type impurity to give the desired resistivity. The mesa 34 in the epitaxial layer is removed by conventional lapping or grinding techniques to the level shown in FIG. 4 so that the thickness of the epitaxial deposit above the top of the mesa is between about 15 and 25 microns. The top surface of the epitaxial layer may be lapped completely flat, or a vestige 36 of the epitaxial mesa may be left to a height of 1 to 2 microns so that subsequent registrations of masks may be facilitated. Alternatively, the epitaxial layer may be lapped perfectly smooth and the subsequent registrations of masks be accomplished by conventional indexing means (not shown).

After the epitaxial mesa 34 is lapped away, a base mask 38, which may be of the conventional oxide type, is deposited on the epitaxial layer. As shown best in FIG. 4, the oxide mask has an opening 40 which extends a substantial distance beyond the sides of the mesa 16 in the degenerate substrate. A p-type impurity, such as boron, is diffused into the epitaxial layer 18 to form the base layer 20 and the collector junction 22.

An emitter oxide mask 42 is deposited on the base oxide mask in a conventional manner, and has an opening 44 which is exactly coincident with the mesa 16 in the degenerate substrate 14. Thereafter, an n-type impurity such as phosphorous is diffused through the emitter oxide mask opening 44 into the base 20 to form the emitter layer 24 and the emitter junction 26, which is congruent and in line with the top surface of the mesa 16.

Thereafter, the electrode contacts are attached to the transistor by conventional techniques.

The transistor shown in FIG. 1 is of the so-called planar type. A mesa transistor is formed if desired by etching away the edges of the transistor as indicated by curved dotted lines 44 in FIG. 1.

The transistor structure shown in FIG. 1 provides an effective low resistivity path in a direction perpendicular to the collector junction and a high effective resistivity path in a transverse direction. The meaning of the term "effective resistivity" is best understood by comparing the structure shown in FIG. 1 with that which would be obtained by prior art techniques. For example, prior art construction would produce a transistor in which the interface between the substrate and collector layer would be a planar extension of the top of the mesa so that the collector layer would be of uniform thickness. Such a prior art structure would have a much lower transverse effective resistivity from a point on the collector junction below the emitter edge to a point on the collector junction below the base electrode contact because the low resistivity substrate would provide prominent parallel paths between the two points. On the other hand, the stepped degenerate substrate of the present invention provides a higher resistance path between the two points, i.e., a higher effective transverse resistivity.

In brief, the invention provides a transistor which uses a relatively high resistivity deposit to achieve high breakdown voltages and low collector capacity. Moreover, the increased thickness of the high resistivity layer not under the emitter, i.e., the large transverse collector effective resistivity, forces the emission of minority carriers from the collector under saturation conditions to stay under the emitter. This means that the emission of the minority carriers modulates more effectively the series resistance in the collector. In other words, the confinement of the minority carriers under the emitter results in saturation voltage drops which are lower than are achievable by ordinary epitaxial techniques when high resistivity layers are used. The confinement of the emission of minority carriers to this region also gives a lower storage time because minority carrier lifetimes are lower in the vicinity of the emitter layer.

In the case of a mesa transistor made in accordance with this invention, there is an added advantage to the structure. The border between the degenerate substrate and the epitaxial layer is further away from the collector junction intersection with the surface than in ordinary epitaxial transistors. This substantially reduces the surface difficulties encountered with prior art high resistivity layer epitaxial transistors.

I claim:

1. A junction transistor comprising a semiconductor body including a collector of a first resistivity, a base, and an emitter separated respectively by collector and emitter junctions, a layer of semiconductor material of a second resistivity bonded to the collector, said second resistivity being lower than said first resistivity, the second resistivity layer including a mesa opposite the emitter and extending into the collector toward the collector junction to form a substantially lower resistivity path to the flow of electric current in a direction perpendicular to the collector junction than in a transverse direction.

2. A junction transistor comprising a semiconductor body including a collector of a first conductivity, a base, and an emitter separated respectively by collector and emitter junctions, and a substrate of a second conductivity bonded to the collector, said second conductivity being higher than said first conductivity, the substrate including a mesa opposite the emitter and extending into the collector toward the collector junction to form a substantially lower effective resistivity path to the flow of electric current in a direction perpendicular to the collector junction than in a transverse direction, the mesa having a top surface area substantially parallel to and in line with the emitter.

3. A junction transistor comprising a semiconductor body including a collector of a first conductivity, a base, and an emitter separated respectively by substantially parallel collector and emitter junctions, the collector junction being of greater area than the emitter junction, a substrate of a second conductivity bonded to the collector, said second conductivity being higher than said first conductivity, the substrate having a mesa opposite the emitter and extending into the collector to form a substantially lower effective resistivity path to the flow of electric current in a direction perpendicular to the collector junction than in a transverse direction, the mesa having a top surface area substantially parallel to the emitter junction.

4. A semiconductor device comprising a body of semiconductor material having collector, base and emitter regions therein, said regions being of alternate conductivity-type material and separated by junctions, said collector region having a first resistance associated therewith, and a layer of semiconductor material of a second resistance bonded to and supporting the collector, said second resistance being lower than said first resistance, the layer of material of said second resistance having an upraised portion thereon opposite the emitter, said upraised portion extending into the collector region thereby reducing in thickness a portion of said collector region, whereby the impedance of said device is substantially reduced.

5. A semiconductor device comprising a substrate of a first resistivity material having an upraised portion on a surface thereof, a collector region of a second resistivity material deposited on the surface of said substrate including said upraised portion, said second resistivity being higher than said first resistivity, a base region deposited on said collector region and an emitter structure deposited on said base opposite the upraised portion, whereby lower capacitance and lower storage time is provided.

References Cited by the Examiner

UNITED STATES PATENTS

| | | | |
|---|---|---|---|
| 2,929,753 | 3/1960 | Noyce | 148—33 |
| 2,952,896 | 9/1960 | Cornelison et al. | 317—235 |
| 2,975,080 | 3/1961 | Armstrong | 148—1.5 |
| 2,977,262 | 3/1961 | Carlson et al. | 148—33 |
| 2,986,481 | 5/1961 | Gudmundsen | 148—1.5 |
| 3,007,090 | 10/1961 | Rutz | 148—1.5 |
| 3,088,856 | 5/1963 | Wannlund et al | 317—235 |
| 3,099,579 | 7/1963 | Spitzer et al. | 148—33 X |

OTHER REFERENCES

Proceedings of the I.R.E., September 1960, pp. 1642–1643.

BENJAMIN HENKIN, *Primary Examiner.*

MARCUS U. LYONS, DAVID L. RECK, *Examiners.*